(12) United States Patent
Gonzalez (10) Patent No.: US 10,952,337 B1
(45) Date of Patent: Mar. 16, 2021

(54) TEMPERATURE-INDICATING MOBILE DEVICE CASE

(71) Applicant: Jerry Gonzalez, Newton, NC (US)

(72) Inventor: Jerry Gonzalez, Newton, NC (US)

( * ) Notice: Subject to any disclaimer, the term of this patent is extended or adjusted under 35 U.S.C. 154(b) by 10 days.

(21) Appl. No.: 16/716,625

(22) Filed: Dec. 17, 2019

(51) Int. Cl.
G06F 1/16 (2006.01)
H05K 5/00 (2006.01)
G01K 7/20 (2006.01)
H05K 5/02 (2006.01)

(52) U.S. Cl.
CPC ............ *H05K 5/0086* (2013.01); *G01K 7/20* (2013.01); *H05K 5/0247* (2013.01)

(58) Field of Classification Search
CPC .... G06F 1/1626; G06F 1/1628; G06F 1/1656; G06F 1/182
USPC ............... 261/679.02, 679.3, 679.55, 679.56
See application file for complete search history.

(56) References Cited

U.S. PATENT DOCUMENTS

| 9,075,570 | B2 | 7/2015 | Yuan | |
|---|---|---|---|---|
| 9,231,641 | B2 | 1/2016 | Sachs | |
| 9,389,656 | B2 | 7/2016 | Lin | |
| D765,645 | S | 9/2016 | Yoon | |
| 10,063,270 | B2 | 8/2018 | Coulter | |
| 2015/0076186 | A1 | 3/2015 | Wong | |
| 2016/0286921 | A1* | 10/2016 | Northrup | A45C 11/00 |
| 2017/0034959 | A1* | 2/2017 | Jang | H04M 1/0202 |
| 2017/0108894 | A1* | 4/2017 | Tannous | G06F 1/1628 |
| 2018/0054502 | A1* | 2/2018 | Wilson | G06F 1/1633 |
| 2018/0294598 | A1* | 10/2018 | Lee | H01R 13/5213 |
| 2019/0064998 | A1* | 2/2019 | Chowdhury | G06F 3/0412 |
| 2019/0075664 | A1* | 3/2019 | Sisson | G06F 1/1656 |
| 2019/0212792 | A1 | 7/2019 | Bailey | |

FOREIGN PATENT DOCUMENTS

WO 2014001896 1/2014

* cited by examiner

*Primary Examiner* — Anthony Q Edwards
(74) *Attorney, Agent, or Firm* — Kyle A. Fletcher, Esq.

(57) ABSTRACT

The temperature indicating mobile device case is configured for use with a personal data device. The temperature indicating mobile device case comprises a PDD shell and a control circuit. The control circuit mounts in the PDD shell. The PDD shell is a protective structure that contains the personal data device such that the personal data device is operable while contained in the PDD shell. The control circuit monitors the exterior surface temperature of the personal data device when the personal data device is stored in the PDD shell. The control circuit generates a first visible indication when the measured temperature of the personal data device is above a previously determined threshold temperature. The control circuit generates a second visible indication when the measured temperature of the personal data device is below the previously determined threshold temperature.

20 Claims, 6 Drawing Sheets

TEMPERATURE-INDICATING MOBILE DEVICE CASE

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of electronic communication technique including details of a transmission device not covered in a single group, more specifically, an arrangement for carrying and protecting a portable transceiver. (H04B1/3888)

SUMMARY OF INVENTION

The temperature indicating mobile device case is configured for use with a personal data device. The temperature indicating mobile device case comprises a PDD shell and a control circuit. The control circuit mounts in the PDD shell. The PDD shell is a protective structure that contains the personal data device such that the personal data device is operable while contained in the PDD shell. The control circuit monitors the exterior surface temperature of the personal data device when the personal data device is stored in the PDD shell. The control circuit generates a first visible indication when the measured temperature of the personal data device is above a previously determined threshold temperature. The control circuit generates a second visible indication when the measured temperature of the personal data device is below the previously determined threshold temperature.

These together with additional objects, features and advantages of the temperature indicating mobile device case will be readily apparent to those of ordinary skill in the art upon reading the following detailed description of the presently preferred, but nonetheless illustrative, embodiments when taken in conjunction with the accompanying drawings.

In this respect, before explaining the current embodiments of the temperature indicating mobile device case in detail, it is to be understood that the temperature indicating mobile device case is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the temperature indicating mobile device case.

It is therefore important that the claims be regarded as including such equivalent construction insofar as they do not depart from the spirit and scope of the temperature indicating mobile device case. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Detailed reference will now be made to one or more potential embodiments of the disclosure, which are illustrated in FIGS. 1 through 7.

The temperature indicating mobile device case 100 (hereinafter invention) is configured for use with a personal data device 101. The invention 100 comprises a PDD shell 102 and a control circuit 103. The control circuit 103 mounts in the PDD shell 102. The PDD shell 102 is a protective structure that contains the personal data device 101 such that the personal data device 101 is operable while contained in the PDD shell 102. The control circuit 103 monitors the exterior surface temperature of the personal data device 101 when the personal data device 101 is stored in the PDD shell 102. The control circuit 103 generates a first visible indication when the measured temperature of the personal data device 101 is above a previously determined threshold temperature. The control circuit 103 generates a second visible indication when the measured temperature of the personal data device 101 is below the previously determined threshold temperature.

The personal data device 101 is a programmable electrical device that provides data management and communication services through one or more functions referred to as an application. The application is a set of logical operating instructions that are performed by the personal data device 101. The addition of an application will provide increased functionality for the personal data device 101. This disclosure assumes that an application exists for the purpose of interacting with the invention 100. Methods to design and implement an application on a personal data device 101 are well known and documented in the electrical arts.

The PDD shell 102 is a rigid structure. The PDD shell 102 contains the personal data device 101 and the printed circuit board 104. The control circuit 103 mounts on the printed circuit board 104. The PDD shell 102 is formed with all apertures and form factors necessary to allow the PDD shell 102 to accommodate the use and operation of the personal data device 101 and the control circuit 103. The PDD shell 102 is a hollow prism-shaped structure. The PDD shell 102 is formed in the manner of a pan. The PDD shell 102 forms a mechanical structure that protects the personal data device 101 from damage. Methods to form a PDD shell 102 suitable for the purposes described in this disclosure are well-known and documented in the mechanical arts.

The PDD shell 102 further comprises a printed circuit board 104. The printed circuit board 104 is a prism-shaped structure. The printed circuit board 104 has a disk shape. The control circuit 103 mounts on the printed circuit board 104 such that the control circuit 103 is contained in the hollow interior of the PDD shell 102 once the printed circuit board 104 is installed in the PDD shell 102.

Figure 1:
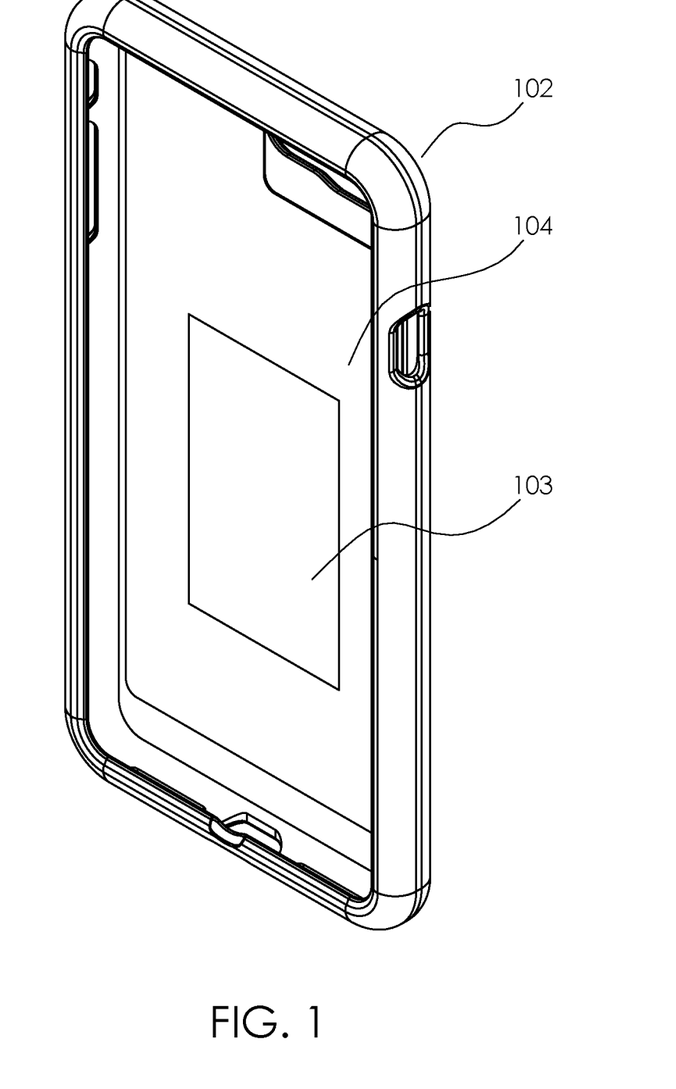
FIG. 1 is a perspective view of an embodiment of the disclosure.
Figure 2:
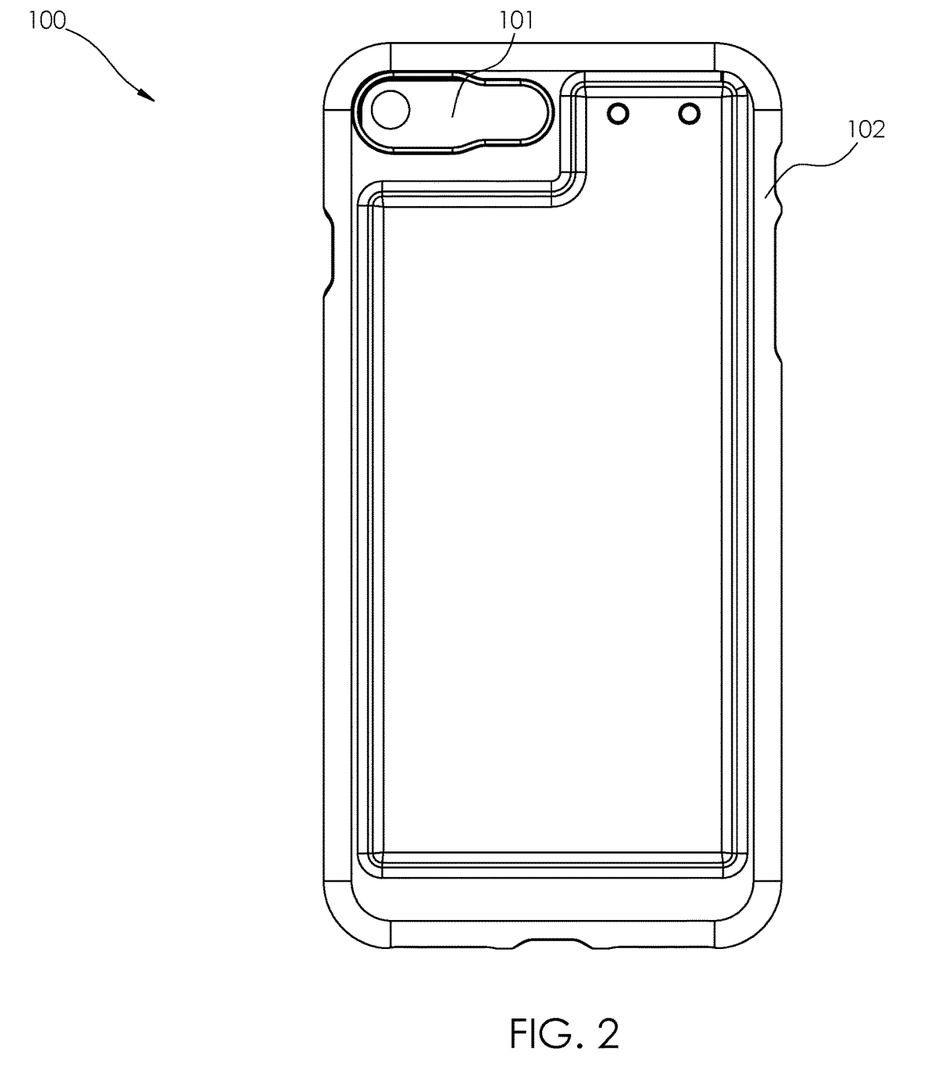
FIG. 2 is a rear view of an embodiment of the disclosure.
Figure 3:
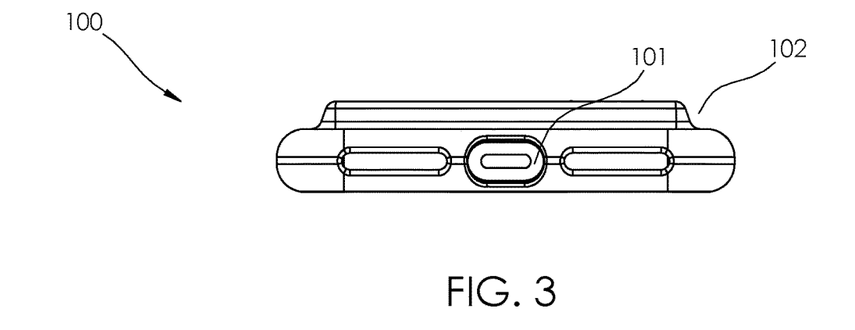
FIG. 3 is a bottom view of an embodiment of the disclosure.
Figure 4:
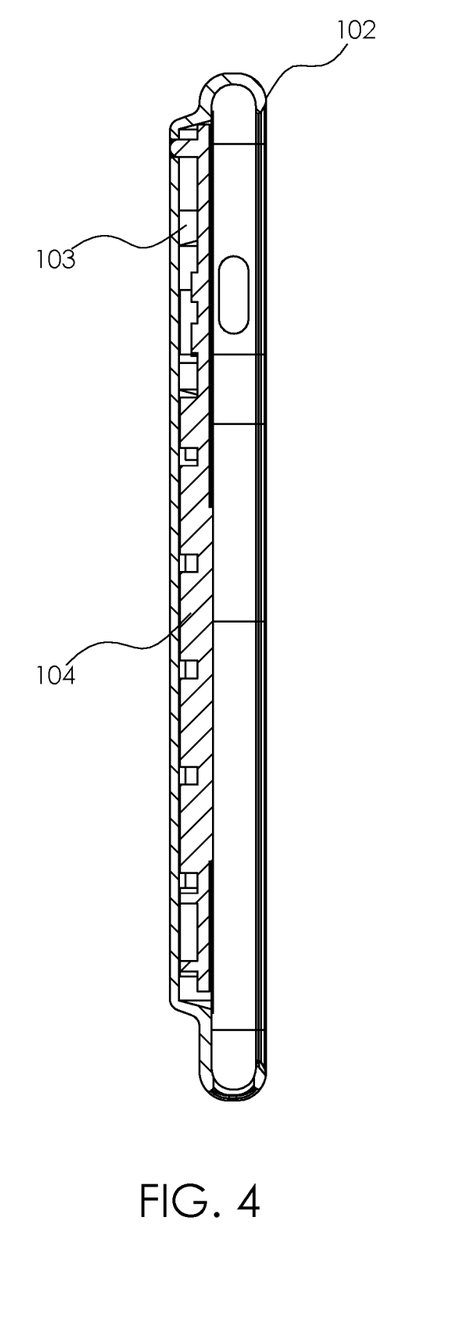
FIG. 4 is a cross-sectional view of an embodiment of the disclosure.
Figure 5:
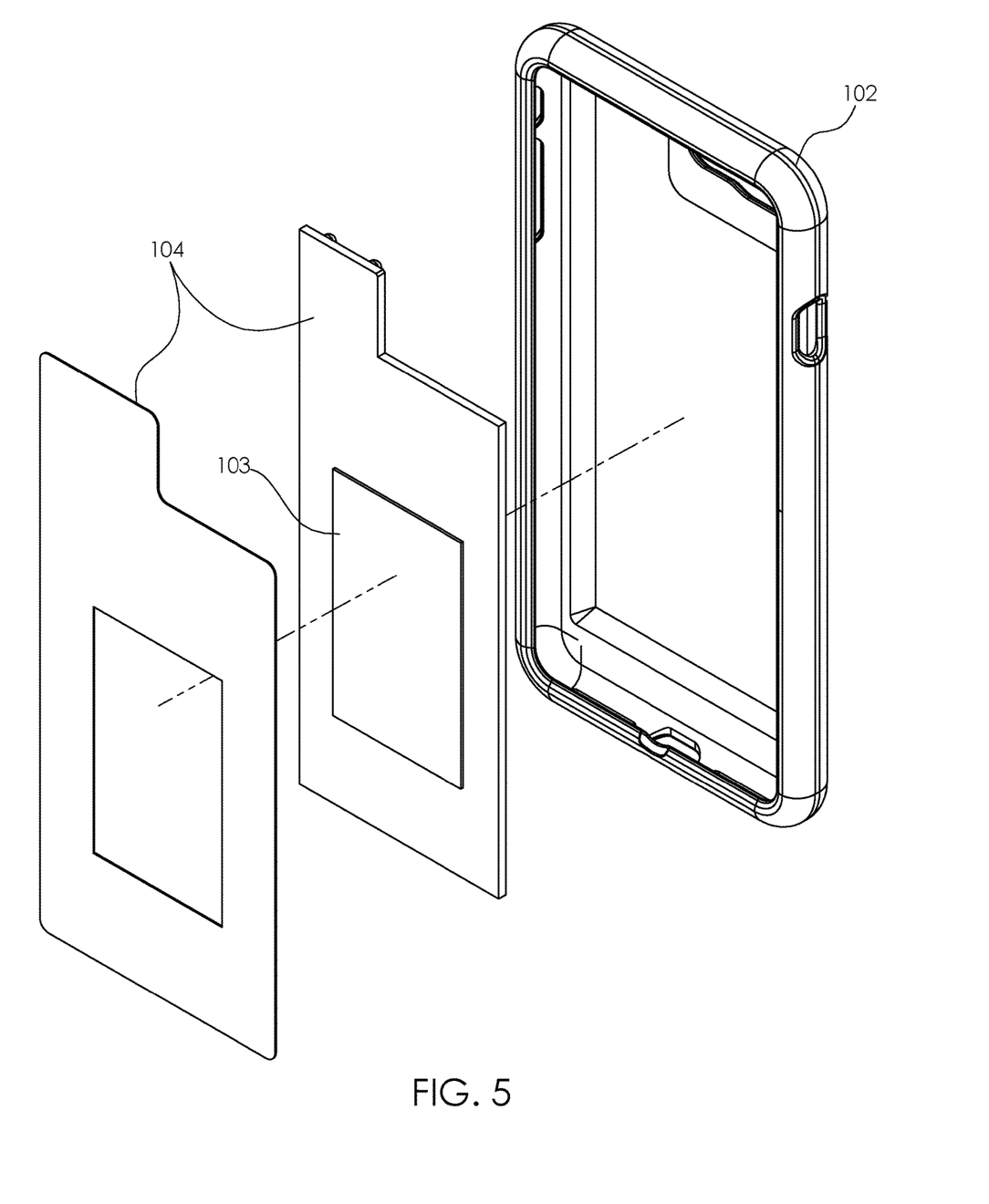
FIG. 5 is an exploded view of an embodiment of the disclosure.
Figure 6:
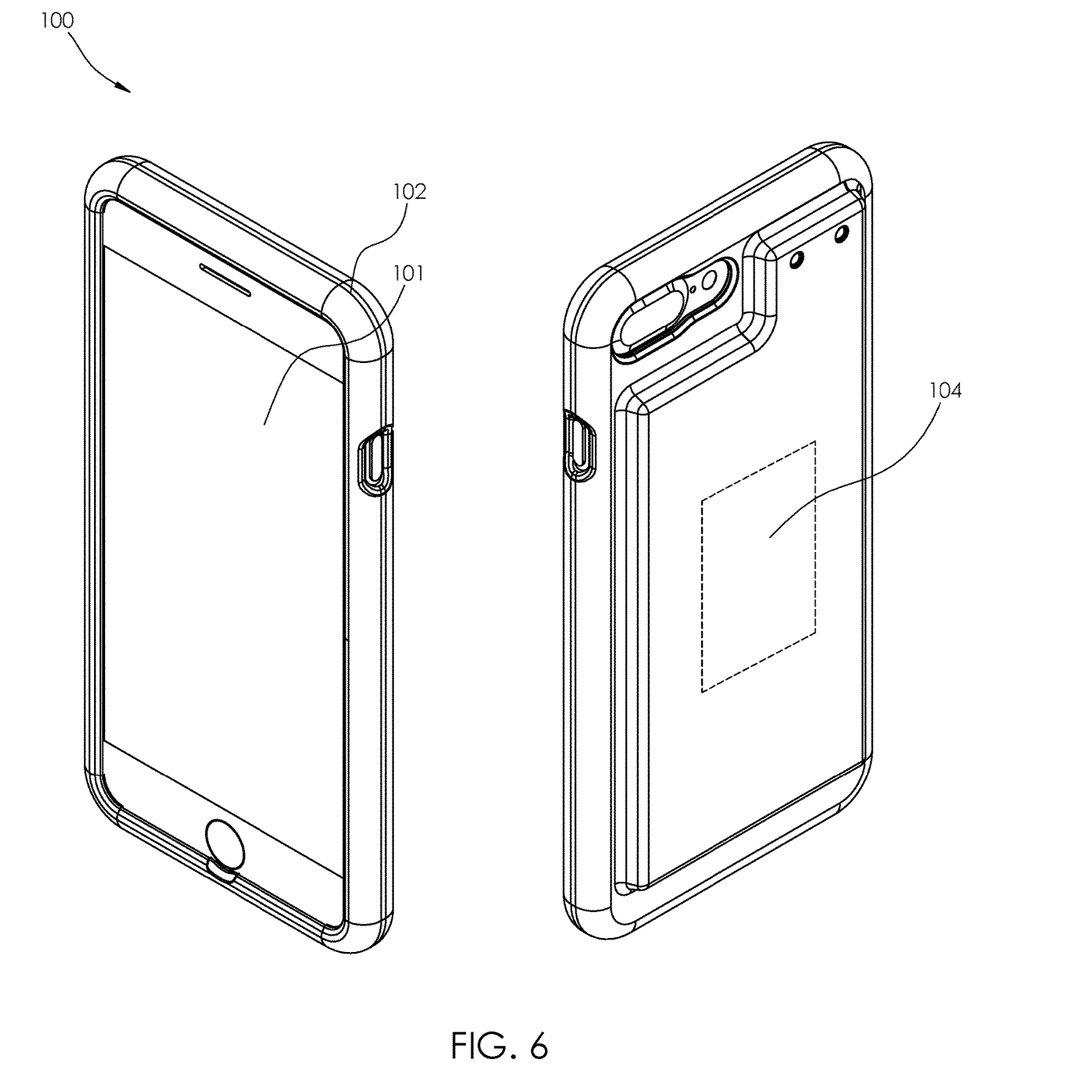
FIG. 6 is an in-use view of an embodiment of the disclosure.
Figure 7:
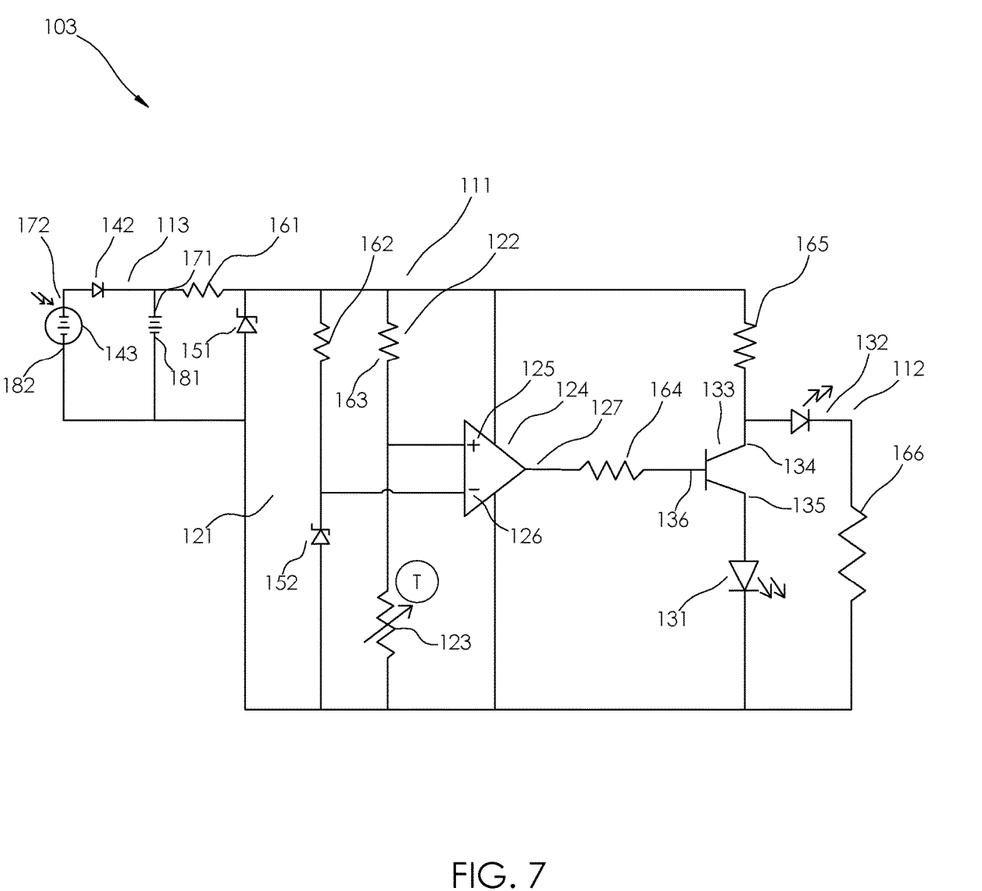
FIG. 7 is a schematic view of an embodiment of the disclosure.

The control circuit 103 is an electric circuit. The control circuit 103 measures and monitors the temperature of the personal data device 101. The control circuit 103 illuminates a first visible indication when the measured temperature of the personal data device 101 is greater than a previously determined threshold temperature. The control circuit 103 illuminates a second visible indication when the measured temperature of the personal data device 101 is lesser than a previously determined threshold temperature. The control circuit 103 is an independently powered electric circuit. By independently powered is meant that the control circuit 103 can operate without an electrical connection to an external power source. The control circuit 103 comprises a comparator circuit 111, a lamp circuit 112, and a power circuit 113. The comparator circuit 111, the lamp circuit 112, and the power circuit 113 are electrically interconnected.

The comparator circuit 111 is an electrical circuit. The comparator circuit 111 measures the temperature of the personal data device 101. The comparator circuit 111 compares the measured temperature of the personal data device 101 with the previously determined threshold temperature. The comparator circuit 111 generates a first electric signal to the lamp circuit 112 that extinguishes the second visual indication and illuminates the first visual indication when the measured temperature of the personal data device 101 is greater than the previously determined threshold temperature. The comparator circuit 111 generates a second electric signal to the lamp circuit 112 that extinguishes the first visual indication and illuminates the second visual indication when the measured temperature of the personal data device 101 is lesser than the previously determined threshold temperature. The comparator circuit 111 comprises a reference circuit 121, a sensor circuit 122, and an amplifier 124. The reference circuit 121, the sensor circuit 122, and the amplifier 124 are electrically interconnected.

The amplifier 124 is an electric circuit. The amplifier 124 is a differential amplifier 124. The amplifier 124 is a commercially available electrical device that: 1) amplifies the difference between a first control signal generated by the reference circuit 121 and a second control signal generated by the sensor circuit 122; and, 2) electrically buffers the reference circuit 121 and the sensor circuit 122 from voltage spikes generated by the lamp circuit 112.

The amplifier 124 receives as a first input a voltage generated by the reference circuit 121. The amplifier 124 receives as a second input a voltage generated by the sensor circuit 122. The amplifier 124 generates as an output a positive voltage signal when the voltage received from the sensor circuit 122 is greater than the voltage generated by the reference circuit 121. The amplifier 124 generates as an output a voltage selected from the group consisting of a zero voltage and a negative voltage signal when the voltage received from the reference circuit 121 is greater than the voltage generated by the sensor circuit 122. The use of an amplifier 124 for the purpose described above is well-known and documented in the electrical arts. The terms amplifier 124 and the differential amplifier 124 are defined elsewhere in this disclosure.

The amplifier 124 further comprises a positive input lead 125, a negative input lead 126, and an output lead 127.

The positive input lead 125 is a first electrical input of the amplifier 124. The positive input lead 125 electrically connects to the voltage signal generated by the sensor circuit 122. Specifically, the positive input lead 125 electrically connects to the thermistor 123 such that the positive input lead 125 measures the electrical voltage presented across the thermistor 123.

The negative input lead 126 is a second electrical input of the amplifier 124. The negative input lead 126 electrically connects to the voltage signal generated by the reference circuit 121. Specifically, the negative input lead 126 electrically connects to the second Zener diode 152 such that the negative input lead 126 measures the electrical voltage presented across the second Zener diode 152.

The output lead 127 provides the output voltage generated by the amplifier 124. The output lead 127 electrically connects to the lamp circuit 112 such that the output voltage generated by the comparator circuit 111 controls the operation of the lamp circuit 112.

The reference circuit 121 is an electric circuit. The reference circuit 121 presents a reference voltage to the amplifier 124. The voltage presented by the reference circuit 121 correlates to a voltage expected from the sensor circuit 122 when the temperature of the personal data device 101 as measured by the sensor circuit 122 equals the previously determined threshold temperature. The reference circuit 121 comprises a second Zener diode 152 and a second resistor 162.

The second Zener diode 152 is a Zener diode. The Zener diode is defined elsewhere in this disclosure. The second Zener diode 152 electrically connects in a series circuit with the battery 141 and the second resistor 162. The second Zener diode 152 electrically connects with the negative input lead 126 of the amplifier 124 such that the negative input lead 126 measures the voltage drop across the second Zener diode 152. The voltage value presented by the second Zener diode 152 is set to present the previously determined threshold temperature to the negative input lead 126 of the amplifier 124.

The second resistor 162 is an electric circuit element used as a limit resistor. The second resistor 162 electrically connects between the first resistor 161 and the second Zener diode 152 such that the second resistor 162 limits the flow of electric current through the second Zener diode 152. The negative input lead 126 specifically measures the voltage found between the second resistor 162 and the second Zener diode 152.

The sensor circuit 122 is an electric circuit. The sensor circuit 122 presents an electric voltage to the amplifier 124. The voltage presented by the sensor circuit 122 is correlated to the previously determined threshold temperature such that: a) the sensor circuit 122 presents a voltage to the amplifier 124 that is greater than the voltage presented to the amplifier 124 by the reference circuit 121 when the measured temperature of the personal data device 101 is greater than the previously determined threshold temperature; and, b) the sensor circuit 122 presents a voltage to the amplifier 124 that is lesser than the voltage presented to the amplifier 124 by the reference circuit 121 when the measured temperature of the personal data device 101 is lesser than the previously determined threshold temperature. The sensor circuit 122 comprises a thermistor 123 and a third resistor 163.

The thermistor 123 is an electrical device. The thermistor 123 is a resistive device. The thermistor 123 measures the temperature of the personal data device 101. The resistance presented by the thermistor 123 in the sensor circuit 122 varies as a function of the measured temperature of the personal data device 101. The thermistor 123 is defined elsewhere in this disclosure. In the first potential embodiment of the disclosure, the thermistor 123 is assumed to be a positive function device. Those skilled in the electrical arts will recognize that a negative function thermistor 123 can substitute for a positive function thermistor 123 without undue experimentation.

The third resistor 163 is an electric circuit element used as a load resistor. The third resistor 163 electrically connects between the first resistor 161 and the thermistor 123 such that the third resistor 163 and the thermistor 123 form a voltage divider. The voltage divider is defined elsewhere in this disclosure. The positive input lead 125 specifically measures the voltage found between the third resistor 163 and the thermistor 123.

The lamp circuit 112 is an electric circuit. The lamp circuit 112 is a switching circuit. The lamp circuit 112 receives the first electric signal and the second electric signal from the comparator circuit 111. The lamp circuit 112 extinguishes the second visual indication and illuminates the first visual indication when the lamp circuit 112 receives the first electric signal. The lamp circuit 112 extinguishes the first visual indication and illuminates the second visual indication when the lamp circuit 112 receives the second electric signal. The lamp circuit 112 comprises a first LED 131, a second LED 132, a transistor 133, a fourth resistor 164, a fifth resistor 165, and a sixth resistor 166. The first LED 131, the second LED 132, the transistor 133, the fourth resistor 164, the fifth resistor 165, and the sixth resistor 166 are electrically interconnected.

The first LED 131 is an electrical device. The lamp circuit 112 controls the operation of the first LED 131. The lamp circuit 112 illuminates the first LED 131 to generate the first visual illumination that indicates that the measured temperature of the personal data device 101 is greater than the previously determined threshold temperature. The first LED 131 electrically connects to the emitter 135 of the transistor 133 such that the first LED 131 illuminates when a voltage is presented to the emitter 135.

The second LED 132 is an electrical device. The lamp circuit 112 controls the operation of the second LED 132. The lamp circuit 112 illuminates the second LED 132 to generate the second visual illumination that indicates that the measured temperature of the personal data device 101 is lesser than the previously determined threshold temperature. The second LED 132 electrically connects to the collector 134 of the transistor 133 such that the second LED 132 illuminates when the transistor 133 is operating as an open switch.

The transistor 133 is an electrical device. The transistor 133 is a switching device. The transistor 133 controls the operation of the first LED 131 and the second LED 132. The transistor 133 further comprises a collector 134, an emitter 135, and a base 136. When a voltage is applied to the base 136, electric current will flow into the base 136 and the transistor 133 will act like a closed switch allowing current to flow from the collector 134 to the emitter 135. When the voltage is removed from the base 136, the transistor 133 will act like an open switch disrupting current flow from the collector 134 to the emitter 135.

The base 136 electrically connects to the output lead 127 of the amplifier 124. When the output lead 127 presents a positive voltage to the base 136, the transistor 133 routes an electric current through the first LED 131 to illuminate the first visual indication. When the output lead 127 presents a zero or negative voltage to the base 136, the transistor 133 routes an electric current through the second LED 132 to illuminate the second visual indication.

The transistor 133 is defined elsewhere in this disclosure. The collector 134 is defined elsewhere in this disclosure. The emitter 135 is defined elsewhere in this disclosure. The base 136 is defined elsewhere in this disclosure.

The fourth resistor 164 is an electric circuit element used as a limit resistor. The fourth resistor 164 electrically connects between the output lead 127 of the amplifier 124 and the base 136 of the transistor 133 such that the fourth resistor 164 limits the flow of electric current into the transistor 133.

The fifth resistor 165 is an electric circuit element used as a limit resistor. The fifth resistor 165 electrically connects between the first resistor 161 and the collector 134 of the transistor 133. The fifth resistor 165 electrically connects between the first resistor 161 and the anode of the second LED 132. The fifth resistor 165 limits the flow of electric current through the transistor 133 and the first LED 131 when the first LED 131 is illuminated. The fifth resistor 165 limits the flow of electric current through the second LED 132 when the second LED 132 is illuminated.

The sixth resistor 166 is an electric circuit element used as a load resistor. The sixth resistor 166 electrically connects between the cathode of the second LED 132 and the first negative terminal 181 of the battery 141. The sixth resistor 166 limits the flow of electric current through the second LED 132 when the second LED 132 is illuminated. The sixth resistor 166 forms a voltage sink that inhibits the flow of electricity through the second LED 132 such that the second LED 132 will not illuminate when the transistor 133 acts as an open switch.

The power circuit 113 is an electrical circuit. The power circuit 113 powers the operation of the control circuit 103. The power circuit 113 is an electrochemical device. The power circuit 113 converts chemical potential energy into the electrical energy required to power the control circuit 103. The power circuit 113 comprises a battery 141, a diode 142, a photovoltaic cell 143, a first Zener diode 151, and a first resistor 161. The battery 141 is further defined with a first positive terminal 171 and a first negative terminal 181. The photovoltaic cell 143 is further defined with a second positive terminal 172 and a second negative terminal 182.

The battery 141, the diode 142 and the photoelectric cell 143 are electrically interconnected.

The battery 141 is an electrochemical device. The battery 141 converts chemical potential energy into the electrical energy used to power the control circuit 103. The battery 141 is a commercially available rechargeable battery 141. The photovoltaic cell 143 is an electrical device that converts light into electrical energy. The chemical energy stored within the rechargeable battery 141 is further renewed and restored through the use of the photovoltaic cell 143. The photovoltaic cell 143 is directly wired to the battery 141. The photovoltaic cell 143 is an electrical circuit that reverses the polarity of the rechargeable battery 141 and provides the energy necessary to reverse the chemical processes that the rechargeable battery 141 initially used to generate the electrical energy. This reversal of the chemical process creates a chemical potential energy that will later be used by the rechargeable battery 141 to generate electricity.

The diode 142 is an electrical device that allows current to flow in only one direction. The diode 142 installs between the rechargeable battery 141 and the photovoltaic cell 143 such that electricity will not flow from the first positive terminal 171 of the rechargeable battery 141 into the second positive terminal 172 of the photovoltaic cell 143.

The first Zener diode 151 is a Zener diode. The Zener diode is defined elsewhere in this disclosure. The first Zener diode 151 electrically connects as a parallel circuit across the comparator circuit 111 and a lamp circuit 112. The purpose of the first Zener diode 151 is to regulate the voltage that powers the reference circuit 121 for the purpose of minimizing fluctuations in the reference voltage generated by the reference circuit 121.

The first resistor 161 is an electric circuit element used as a limit resistor. The first resistor 161 electrically connects the battery 141 to the first Zener diode 151 such that the first resistor 161 limits the flow of electric current through the first Zener diode 151.

The battery 141, the diode 142, and the photoelectric cell 143 are defined elsewhere in this disclosure.

The following definitions were used in this disclosure:

Amplifier: As used in this disclosure, an amplifier refers to an electronic component that increases voltage, current, or power of an input signal. Specifically, within this disclosure, an amplifier refers to a differential amplifier. A differential amplifier is a device with two inputs with a single output. A differential amplifier amplifies the voltage difference between the two inputs.

Battery: As used in this disclosure, a battery is a chemical device consisting of one or more cells, in which chemical energy is converted into electricity and used as a source of power. Batteries are commonly defined with a positive terminal and a negative terminal.

Diode: As used in this disclosure, a diode is a two terminal semiconductor device that allows current flow in only one direction. The two terminals are called the anode and the cathode. Electric current is allowed to pass from the anode to the cathode.

Disk: As used in this disclosure, a disk is a prism-shaped object that is flat in appearance. The disk is formed from two congruent ends that are attached by a lateral face. The sum of the surface areas of two congruent ends of the prism-shaped object that forms the disk is greater than the surface area of the lateral face of the prism-shaped object that forms the disk. In this disclosure, the congruent ends of the prism-shaped structure that forms the disk are referred to as the faces of the disk.

External Power Source: As used in this disclosure, an external power source is a source of the energy that is externally provided to enable the operation of the present disclosure. Examples of external power sources include, but are not limited to, electrical power sources and compressed air sources.

Form Factor: As used in this disclosure, the term form factor refers to the size and shape of an object.

LED: As used in this disclosure, an LED is an acronym for a light emitting diode. A light emitting diode is a diode that is also a light source.

Limit Resistor: As used in this disclosure, a limit resistor is an electrical resistor that is used to limit the flow of electric current through an electrical circuit.

Load Resistor: As used in this disclosure, a load resistor is an electrical resistor that is used to present a voltage to an electrical device. The presented voltage is controlled by controlling the amount of electrical current passing through the load resistor.

Pan: As used in this disclosure, a pan is a hollow and prism-shaped containment structure. The pan has a single open face. The open face of the pan is often, but not always, the superior face of the pan. The open face is a surface selected from the group consisting of: a) an end of the prism structure that forms the pan; and, b) a lateral face of the prism structure that forms the pan. A semi-enclosed pan refers to a pan wherein an end of prism structure of the pan and a portion of the lateral face of the pan is also open.

Parallel Circuit: As used in this disclosure, a parallel circuit refers to a method of electrically connecting a plurality of circuit elements to a voltage source. In a parallel circuit each circuit element receives a voltage equal to the full voltage produced by the voltage source.

PDD: As used in this disclosure, PDD is an acronym for personal data device.

Personal Data Device: As used in this disclosure, a personal data device is a handheld logical device that is used for managing personal information and communication. Examples of personal data device include, but are not limited to, cellular phones, tablets, and smartphones.

Photoelectric: As used in this disclosure, photoelectric is an adjective used to describe an electronic component in which the performance of the electronic component is modified by light. Typical photoelectric devices include, but are not limited to, photoelectric transistors, photoelectric diodes, and photoelectric resistors.

Photovoltaic Cell: As used in this disclosure, a photovoltaic cell is a photoelectric device that directly converts light energy into electrical energy.

Prism: As used in this disclosure, a prism is a three-dimensional geometric structure wherein: 1) the form factor of two faces of the prism are congruent; and, 2) the two congruent faces are parallel to each other. The two congruent faces are also commonly referred to as the ends of the prism. The surfaces that connect the two congruent faces are called the lateral faces. In this disclosure, when further description is required a prism will be named for the geometric or descriptive name of the form factor of the two congruent faces. If the form factor of the two corresponding faces has no clearly established or well-known geometric or descriptive name, the term irregular prism will be used. The center axis of a prism is defined as a line that joins the center point of the first congruent face of the prism to the center point of the second corresponding congruent face of the prism. The center axis of a prism is otherwise analogous to the center axis of a cylinder. A prism wherein the ends are circles is commonly referred to as a cylinder.

Pull-Up Resistor: As used in this disclosure, a pull-up resistor is an electrical resistor that is used to: 1) limit the current flow through a switching device; and, 2) to control the voltage level presented across a switch, a load resistor, or a pull-down resistor.

Regulated Voltage: As used in this disclosure, a regulated voltage refers to a source of DC voltage that incorporates circuitry that reduces changes in output voltages that occur in response to changes to the circuit's input power supply voltage or to changes in output, or load, current.

Resistor: As used in this disclosure, a resistor is a well-known and commonly available electrical device that presents a resistance that inhibits the flow of electricity through an electric circuit. Within an electric circuit processing alternating currents, the resistor will not affect the phase of the alternating current. A current flowing through a resistor will create a voltage across the terminals of the resistor.

Series Circuit: As used in this disclosure, a series circuit refers to a method of electrically connecting a plurality of circuit elements to a voltage source. In a series circuit, the proportion of the voltage received by each individual circuit element is divided proportionally between the plurality circuit elements based on the resistance (or impedance) of each circuit element relative to the total resistance of the plurality of circuit elements. The series circuit forms a linear or loop structure often referred to as a daisy chain.

Shell: As used in this disclosure, a shell is a structure that forms an outer covering intended to contain an object. Shells are often, but not necessarily, rigid or semi-rigid structures that are intended to protect the object contained within it.

Thermistor: As used in this disclosure, a thermistor is an electric circuit element that presents a resistance that varies as a function of the temperature of the thermistor. A thermistor can vary as a positive function (the resistance of the thermistor increases with an increase in temperature) of temperature or a negative function (the resistance of the thermistor decreases with an increase in temperature) of temperature.

Transistor: As used in this disclosure, a transistor is a general term for a three-terminal semiconducting electrical device that is used for electrical signal amplification and electrical switching applications. There are several designs of transistors. A common example of a transistor is an NPN transistor that further comprises a collector terminal, an emitter terminal, and a base terminal and which consists of a combination of two rectifying junctions (a diode is an example of a rectifying junction). Current flowing from the collector terminal through the emitter terminal crosses the two rectifier junctions. The amount of the electric current crossing the two rectified junctions is controlled by the amount of electric current that flows through the base terminal. This disclosure assumes the use of an NPN transistor. This assumption is made solely for the purposes of simplicity and clarity of exposition. Those skilled in the electrical arts will recognize that other types of transistors, including but not limited to, field effect transistors and PNP transistors, can be substituted for an NPN transistor without undue experimentation.

Unregulated Voltage: This refers to a source of DC voltage that changes in response to changes to the circuit's input power supply voltage or to changes in output, or load, current.

Voltage Divider: As used in this disclosure, a voltage divider is an electric circuit that comprises a plurality of resistors electrically connected in series. The voltage divider divides a voltage presented across the plurality of resistors into one or more smaller voltages that can be used elsewhere in an electric circuit. The value of the one or more smaller voltages presented by the voltage divider is controlled through the selection of the value of each of the plurality of resistors.

Voltage Regulator: As used in this disclosure, a voltage regulator refers to an electrical circuit that takes unregulated voltage as its power input and provides a constant output voltage independent of variations to input power supply voltage or output, or load, current.

Zener Diode: As used in this disclosure, a Zener diode is a two terminal electrical device that is used to generate a known voltage that is relatively independent variations in the voltage applied to the Zener diode. The known voltage is referred to as the Zener voltage.

With respect to the above description, it is to be realized that the optimum dimensional relationship for the various components of the invention described above and in FIGS. 1 through 7 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. A temperature indicating mobile device case comprising
    a PDD shell and a control circuit;
    wherein the control circuit mounts in the PDD shell;
    wherein the temperature indicating mobile device case is configured for use with a personal data device;
    wherein the personal data device is a programmable electrical device;
    wherein the PDD shell is a protective structure that contains the personal data device such that the personal data device is operable while contained in the PDD shell;
    wherein the temperature indicating mobile device case monitors the exterior surface temperature of the personal data device when the personal data device is stored in the PDD shell.

2. The temperature indicating mobile device case according to claim 1
    wherein the temperature indicating mobile device case generates a first visible indication when the measured temperature of the personal data device is above a previously determined threshold temperature;
    wherein the temperature indicating mobile device case generates a second visible indication when the measured temperature of the personal data device is below the previously determined threshold temperature.

3. The temperature indicating mobile device case according to claim 2
    wherein the PDD shell is a rigid structure;
    wherein the PDD shell is a disk-shaped structure;
    wherein the PDD shell is formed in the manner of a pan;
    wherein the PDD shell forms a mechanical structure that protects the personal data device from damage.

4. The temperature indicating mobile device case according to claim 3 wherein the control circuit is an electric circuit;

wherein the control circuit measures and monitors the temperature of the personal data device;

wherein the control circuit illuminates a first visible indication when the measured temperature of the personal data device is greater than a previously determined threshold temperature;

wherein the control circuit illuminates a second visible indication when the measured temperature of the personal data device is lesser than a previously determined threshold temperature.

5. The temperature indicating mobile device case according to claim 4 wherein the control circuit is an independently powered electric circuit;

wherein by independently powered is meant that the control circuit can operate without an electrical connection to an external power source.

6. The temperature indicating mobile device case according to claim 5 wherein the control circuit comprises a comparator circuit, a lamp circuit, and a power circuit;

wherein the comparator circuit, the lamp circuit, and the power circuit are electrically interconnected.

7. The temperature indicating mobile device case according to claim 6 wherein the comparator circuit is an electrical circuit;

wherein the comparator circuit measures the temperature of the personal data device;

wherein the comparator circuit compares the measured temperature of the personal data device with the previously determined threshold temperature;

wherein the comparator circuit generates a first electric signal to the lamp circuit that extinguishes the second visual indication and illuminates the first visual indication when the measured temperature of the personal data device is greater than the previously determined threshold temperature;

wherein the comparator circuit generates a second electric signal to the lamp circuit that extinguishes the first visual indication and illuminates the second visual indication when the measured temperature of the personal data device is lesser than the previously determined threshold temperature.

8. The temperature indicating mobile device case according to claim 7 wherein the lamp circuit is an electric circuit;

wherein the lamp circuit is a switching circuit;

wherein the lamp circuit receives the first electric signal and the second electric signal from the comparator circuit;

wherein the lamp circuit extinguishes the second visual indication and illuminates the first visual indication when the lamp circuit receives the first electric signal;

wherein the lamp circuit extinguishes the first visual indication and illuminates the second visual indication when the lamp circuit receives the second electric signal.

9. The temperature indicating mobile device case according to claim 8 wherein the power circuit is an electrical circuit;

wherein the power circuit powers the operation of the control circuit;

wherein the power circuit converts chemical potential energy into the electrical energy required to power the control circuit.

10. The temperature indicating mobile device case according to claim 9 wherein the comparator circuit comprises a reference circuit, a sensor circuit, and an amplifier;

wherein the reference circuit, the sensor circuit, and the amplifier are electrically interconnected.

11. The temperature indicating mobile device case according to claim 10 wherein the lamp circuit comprises a first LED, a second LED, a transistor, a fourth resistor, a fifth resistor, and a sixth resistor;

wherein the first LED, the second LED, the transistor, the fourth resistor, the fifth resistor, and the sixth resistor are electrically interconnected.

12. The temperature indicating mobile device case according to claim 11 wherein the power circuit comprises a battery, a diode, a photovoltaic cell, a first Zener diode, and a first resistor;

wherein the battery is further defined with a first positive terminal and a first negative terminal;

wherein the photovoltaic cell is further defined with a second positive terminal and a second negative terminal;

wherein the battery, the diode, the photovoltaic cell, the first Zener diode, and the first resistor are electrically interconnected.

13. The temperature indicating mobile device case according to claim 12 wherein the amplifier is an electric circuit;

wherein the amplifier is a differential amplifier;

wherein the amplifier receives as a first input a voltage generated by the reference circuit;

wherein the amplifier receives as a second input a voltage generated by the sensor circuit;

wherein the amplifier generates as an output a positive voltage signal when the voltage received from the sensor circuit is greater than the voltage generated by the reference circuit;

wherein the amplifier generates as an output a voltage selected from the group consisting of a zero voltage and a negative voltage signal when the voltage received from the reference circuit is greater than the voltage generated by the sensor circuit;

wherein the reference circuit is an electric circuit;

wherein the reference circuit presents a reference voltage to the amplifier;

wherein the voltage presented by the reference circuit correlates to a voltage expected from the sensor circuit when the temperature of the personal data device as measured by the sensor circuit equals the previously determined threshold temperature;

wherein the sensor circuit is an electric circuit;

wherein the sensor circuit presents an electric voltage to the amplifier;

wherein the voltage presented by the sensor circuit is correlated to the previously determined threshold temperature such that: a) the sensor circuit presents a voltage to the amplifier that is greater than the voltage presented to the amplifier by the reference circuit when the measured temperature of the personal data device is greater than the previously determined threshold temperature; and, b) the sensor circuit presents a voltage to the amplifier that is lesser than the voltage presented to the amplifier by the reference circuit when the measured temperature of the personal data device is lesser than the previously determined threshold temperature.

14. The temperature indicating mobile device case according to claim 13
wherein the amplifier further comprises a positive input lead, a negative input lead, and an output lead;
wherein the positive input lead is a first electrical input of the amplifier;
wherein the positive input lead electrically connects to the voltage signal generated by the sensor circuit;
wherein the negative input lead is a second electrical input of the amplifier;
wherein the negative input lead electrically connects to the voltage signal generated by the reference circuit;
wherein the output lead provides the output voltage generated by the amplifier;
wherein the output lead electrically connects to the lamp circuit such that the output voltage generated by the comparator circuit controls the operation of the lamp circuit.

15. The temperature indicating mobile device case according to claim 14
wherein the reference circuit comprises a second Zener diode and a second resistor;
wherein the second Zener diode is a Zener diode;
wherein the second Zener diode electrically connects in a series circuit with the battery and the second resistor;
wherein the second Zener diode electrically connects with the negative input lead of the amplifier such that the negative input lead measures the voltage drop across the second Zener diode;
wherein the voltage value presented by the second Zener diode is set to present the previously determined threshold temperature to the negative input lead of the amplifier;
wherein the second resistor is an electric circuit element used as a limit resistor;
wherein the second resistor electrically connects between the first resistor and the second Zener diode such that the second resistor limits the flow of electric current through the second Zener diode;
wherein the negative input lead specifically measures the voltage found between the second resistor and the second Zener diode.

16. The temperature indicating mobile device case according to claim 15
wherein the sensor circuit comprises a thermistor and a third resistor;
wherein the thermistor is an electrical device;
wherein the thermistor is a resistive device;
wherein the thermistor measures the temperature of the personal data device;
wherein the resistance presented by the thermistor in the sensor circuit varies as a function of the measured temperature of the personal data device;
wherein the third resistor is an electric circuit element used as a load resistor;
wherein the third resistor electrically connects between the first resistor and the thermistor such that the third resistor and the thermistor form a voltage divider;
wherein the positive input lead specifically measures the voltage found between the third resistor and the thermistor.

17. The temperature indicating mobile device case according to claim 16
wherein the first LED is an electrical device;
wherein the lamp circuit controls the operation of the first LED;
wherein the lamp circuit illuminates the first LED to generate the first visual illumination that indicates that the measured temperature of the personal data device is greater than the previously determined threshold temperature;
wherein the first LED electrically connects to the emitter of the transistor such that the first LED illuminates when a voltage is presented to the emitter;
wherein the second LED is an electrical device;
wherein the lamp circuit controls the operation of the second LED;
wherein the lamp circuit illuminates the second LED to generate the second visual illumination that indicates that the measured temperature of the personal data device is lesser than the previously determined threshold temperature;
wherein the second LED electrically connects to the collector of the transistor such that the second LED illuminates when the transistor is operating as an open switch;
wherein the transistor is an electrical device;
wherein the transistor is a switching device;
wherein the transistor controls the operation of the first LED and the second LED.

18. The temperature indicating mobile device case according to claim 17
wherein the transistor further comprises a collector, an emitter, and a base;
wherein the base electrically connects to the output lead of the amplifier;
wherein when the output lead presents a positive voltage to the base, the transistor routes an electric current through the first LED to illuminate the first visual indication;
wherein when the output lead presents a zero or negative voltage to the base, the transistor routes an electric current through the second LED to illuminate the second visual indication;
wherein the fourth resistor is an electric circuit element used as a limit resistor;
wherein the fourth resistor electrically connects between the output lead of the amplifier and the base of the transistor such that the fourth resistor limits the flow of electric current into the transistor;
wherein the fifth resistor is an electric circuit element used as a limit resistor;
wherein the fifth resistor electrically connects between the first resistor and the collector of the transistor;
wherein the fifth resistor electrically connects between the first resistor and the anode of the second LED;
wherein the fifth resistor limits the flow of electric current through the transistor and the first LED when the first LED is illuminated;
wherein the fifth resistor limits the flow of electric current through the second LED when the second LED is illuminated;
wherein the sixth resistor is an electric circuit element used as a load resistor;
wherein the sixth resistor electrically connects between the cathode of the second LED and the first negative terminal of the battery;
wherein the sixth resistor limits the flow of electric current through the second LED when the second LED is illuminated;
wherein the sixth resistor forms a voltage sink that inhibits the flow of electricity through the second LED such that the second LED will not illuminate when the transistor acts as an open switch.

19. The temperature indicating mobile device case according to claim 18
wherein the battery is a rechargeable battery;
wherein the photovoltaic cell is an electrical device that converts light into electrical energy;
wherein the photovoltaic cell is an electrical circuit that reverses the polarity of the rechargeable battery and provides the energy necessary to reverse the chemical processes that the rechargeable battery initially used to generate the electrical energy;
wherein the diode is an electrical device that allows current to flow in only one direction;
wherein the diode installs between the rechargeable battery and the photovoltaic cell such that electricity will not flow from the first positive terminal of the rechargeable battery into the second positive terminal of the photovoltaic cell;
wherein the first Zener diode is a Zener diode;
wherein the Zener diode is defined elsewhere in this disclosure;
wherein the first Zener diode electrically connects as a parallel circuit across the comparator circuit and a lamp circuit;
wherein the first resistor is an electric circuit element used as a limit resistor;
wherein the first resistor electrically connects the battery to the first Zener diode such that the first resistor limits the flow of electric current through the first Zener diode.

20. The temperature indicating mobile device case according to claim 19
wherein the PDD shell further comprises a printed circuit board;
wherein the printed circuit board has a disk shape;
wherein the control circuit mounts on the printed circuit board such that the control circuit is contained in the hollow interior of the PDD shell once the printed circuit board is installed in the PDD shell.

\* \* \* \* \*